United States Patent [19]

Dobrovolny et al.

[11] 3,909,726

[45] Sept. 30, 1975

[54] UHF HYBRID TUNER

[75] Inventors: Pierre Dobrovolny, North Riverside; Stanley P. Knight, Arlington Heights, both of Ill.

[73] Assignee: Zenith Radio Corporation, Chicago, Ill.

[22] Filed: Sept. 26, 1973

[21] Appl. No.: 400,772

[52] U.S. Cl. .................... 325/357; 325/445; 357/75

[51] Int. Cl.².. H04B 1/08; H04B 1/26; H01L 23/16

[58] Field of Search ........... 325/352, 357, 452, 457, 325/459, 462, 464, 465, 318, 445, 451; 317/234 H, 234 UA; 334/15; 357/75, 84

[56] References Cited

UNITED STATES PATENTS

| | | | |
|---|---|---|---|
| 3,271,685 | 9/1966 | Husher et al. | 325/451 X |
| 3,534,267 | 10/1970 | Hyltin | 325/445 |
| 3,641,441 | 2/1972 | Gunn et al. | 325/451 X |
| 3,643,168 | 2/1972 | Manicki | 325/352 |
| 3,651,409 | 3/1972 | George et al. | 325/445 |
| 3,659,205 | 4/1972 | Cooke et al. | 325/462 X |
| 3,662,271 | 5/1972 | Wakanishi | 325/459 |
| 3,806,844 | 4/1974 | Buckley et al. | 334/15 |

*Primary Examiner*—Robert L. Griffin
*Assistant Examiner*—Aristotelis M. Psitos
*Attorney, Agent, or Firm*—Nicholas A. Camasto

[57] ABSTRACT

A UHF television tuner includes a radio-frequency amplifier, a local oscillator and a mixer enclosed in a box-like housing within which is suspended an insulative substrate. A first conductive layer is disposed on the substrate in a disconnected pattern of a plurality of connective elements. A second layer of dielectric material overlies the first layer in a disconnected pattern. A third layer of conductive material overlies the second layer in a disconnected pattern that, together with the first and second layers, defines: (1) a variety of capacitive elements; (2) a variety of inductive elements; and (3) defines another plurality of connective elements. A fourth layer of resistive material is disposed in a disconnected pattern and interconnects different portions of the first and third layers, thereby completing the definition of all connective elements and defining the resistive elements. Active elements, such as varactor diodes, are mounted on the substrate in interconnecting relationship with the first and third layers. The different patterns of the various layers, together with a very few discrete components, including the active devices, serve to define a complete UHF tuner in a very small volume. Certain of the various patterns also form circuits that exhibit advantageous selectivity and tuning characteristics.

13 Claims, 6 Drawing Figures

UHF HYBRID TUNER

BACKGROUND OF THE INVENTION

The present invention relates to UHF signal-processing circuitry. More particularly, such circuitry is embodied in a highly compact and yet comparatively simple structural assembly.

Particularly with the advent of television broadcasting in the ultra-high frequency region of the spectrum, extending generally from 470 through 890 megahertz, numerous approaches have been offered with respect to the design and construction of tuners capable of receiving broadcasts within that frequency range. In accordance with the conventional superheterodyne approach, such tuners typically include a radio-frequency amplifier tunable to receive a selected signal within the UHF range, a local oscillator tunable to develop a mixing signal that is displaced in frequency from that of the selected signal by a constant amount and a mixer which responds to the selected and mixing signals for producing a constant-frequency intermediate signal. In order that the intermediate signal remains at a constant frequency as the amplifier is tuned from one end of the range to the other, it is, of course, necessary that all three basic stages be capable of tracking each other throughout the range. The need for this quality has led to a high degree of design sophistication. However, success has usually been at the cost of substantial complexity.

UHF tuner design often has included the use of transmission lines to serve as inductive elements in the circuitry. In some cases, at least a portion of the transmission line structure has been formed by use of different portions of the associated chassis. In other cases, separate wires or metal strips have been particularly sized and shaped so as, when properly positioned relative to the chassis or other components, to complete the formation of necessary resonant circuits. Still differently, metallic strips, printed or otherwise formed on opposing substrate surfaces, have been employed to serve both as inductive transmission lines and as plates of associated capacitors. In another approach involving printed or otherwise deposited metallic areas, a substrate has been suspended between the metal walls of a housing, and different metallic strips are oriented on the same side of the substrate in a manner to form both inductive elements and associated capacitive elements. Difficulties encountered with these prior printed-type approaches include the use of ground paths which extend around substrate edges and through conductors on opposing substrate sides or through the walls of the housing. These difficulties lead to circuitry which at times offers insufficient isolation from other stages and involves the need for special mechanical mounting provisions.

Quite typically, UHF tuners have been of the so-called hybrid type, involving the use of some printed circuitry, such as inductive and connective elements, and separately-mounted discrete passive and active elements such as capacitors, resistors and transistors. While fabrication techniques have been known which are capable of forming, by thick-film or thin-film disposition on a substrate, at least most of the various different passive components necessary to constitute a complete tuner system, the resulting combinations usually have been unduly complicated and expensive of assembly, even to the point that most such UHF tuners have been capable of being manufactured economically only in locales where labor is available at significantly lower wage rates.

OBJECTS OF THE INVENTION

It is, accordingly, a general object of the present invention to provide a new and improved UHF tuner which overcomes, at least to a significant extent, the problems, difficulties and deficiencies discussed above.

Another object of the present invention is to provide a new and improved UHF tuner which is capable of being manufactured with only an exceedingly small amount of direct labor cost.

A further object of the present invention is to provide a new and improved UHF tuner fabricated in such a way that various elements of inductance and capacitance incorporated into the circuitry are accurately repeatable in production.

Still other objects of the present invention are related to the provision of new and improved UHF signal processing stages of several different varieties having both general utility and also particular advantages for incorporation in television tuners.

In one aspect, the invention involves a tuner receptive of broad-band signals in the ultra-high-frequency range. It includes a radio-frequency amplifier tunable to receive a selected signal in that range, a local oscillator tunable to develop a mixing signal displaced in frequency from that of the selected frequency by a constant amount and a mixer which responds to the selected and mixing signals for producing a constant-frequency intermediate signal. Each of the amplifier, oscillator and mixer are composed of inductive, capacitive, resistive, connective and active elements. In a featured improvement of the tuner, it includes a box-like housing having walls of electrically conductive material. Suspended within the housing is a substrate of electrically insulative material. A first layer of electrically conductive material is disposed on the substrate in a disconnected pattern of a plurality of connective elements in the tuner. Overlying the first layer in a disconnected pattern is a second layer of at least one dielectric material, partially forming the capacitive elements of the tuner. A third layer of electrically conductive material overlies the second layer in a disconnected pattern defining with the first and second layers the capacitive elements, a portion of the inductive elements and defining another plurality of connective elements. A fourth layer of at least one resistive material, disposed again in a disconnected pattern, interconnects different portions of the first and third layers to complete the definition of the connective elements and form resistive elements. The tuner also includes means mounting active elements on the substrate in interconnective relationship with the first and third layers.

BRIEF DESCRIPTION OF THE DRAWINGS

The features of this invention which are believed to be novel are set forth with particularity in the appended claims. The invention, together with further objects and advantages thereof, may best be understood, however, by reference to the following description taken in conjunction with the accompanying drawings, in the several figures of which like reference numerals identify like elements, and in which:

DESCRIPTION OF THE PREFERRED EMBODIMENTS

Figure 1:
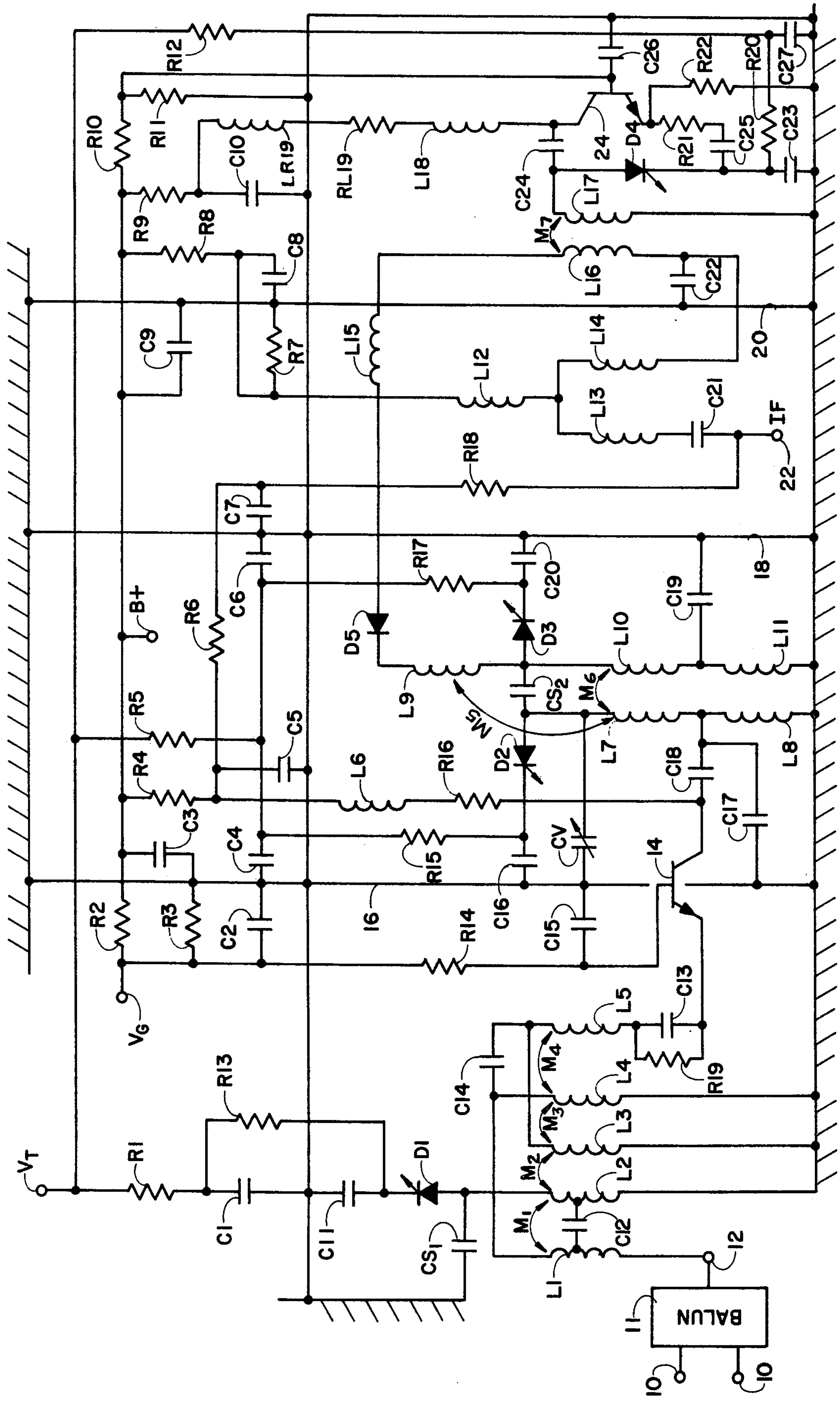
FIG. 1 is a schematic diagram of a tuner embodying the present invention.

In the television tuner of FIG. 1, the received broadband signal conventionally appearing at antenna terminals 10 at an impedance level of 300 ohms are converted by a balun 11 to an impedance level, at a terminal 12, of approximately 75 ohms. Spaced successively one after another is a plurality of inductors L1, L2, L3, L4 and L5 which constitute principal parts in the input section of a radio-frequency amplifier. Each inductor is mutually coupled to the next as indicated by the respective curved arrows M. The lower end of inductor L1 is connected to terminal 12, while its upper end is connected directly to the upper end of inductor L4 and also is coupled through a capacitor C14 to the upper ends of each of inductors L3 and L5. The lower ends of each of inductors L2, L3 and L4 all are connected to a ground plane. Coupling respective taps on inductors L1 and L2 is a capacitor C12. The emitter of an NPN transistor 14 is coupled to the lower end of inductor L5 through a capacitor C13, which is shunted by a resistor R19. Completing the connection to the input-section inductors, the top end of inductor L2 is connected to the anode of a varactor diode D1, the cathode of which is connected to a source of tuning voltage $V_T$ through the series combination of resistor R13 and a resistor R1. The cathode of diode D1 is coupled to a ground plane through a capacitor C11, while its anode is coupled to the ground plane by stray capacitance designated $CS_1$. The junction between resistors R1 and R13 is coupled to the ground plane by a capacitor C1.

A resistor R14 connects an automatic gain control potential terminal $V_G$ to the base of transistor 14. The junction between R14 and the base of transistor 14 is coupled to a ground plane 16 through a capacitor C15. Ground plane 16 (represented by a line) extends entirely across the layout from top to bottom and is connected at each end to a peripheral ground plane as indicated. Automatic gain control terminal $V_G$ is coupled to ground plane 16 by a capacitor C2 and by a resistor R3. Completing the DC collector return circuit of transistor 14 of the radio-frequency amplifier stage is a connection from the collector of that transistor through a resistor R16, a choke L6 and a resistor R4, to a power supply terminal B+. Terminal $V_G$ is connected to the B+ terminal through a resistor R2. Power supply terminal B+ is bypassed to the ground plane through a capacitor C3 on the left side of FIG. 1 and through a capacitor C9 on the right side.

The area to the left of ground plane 16 is the input section of the radio-frequency amplifier and thus includes the tunable signal-selecting circuit featuring the succession of inductors L1–L5 single-tuned by varactor diode D1. On the other hand, the output circuit of that amplifier extends generally between ground plane 16 and another ground plane (also illustrated by a lead) 18 which also extends across the entire layout and is connected at its top and bottom to respective peripheral ground planes. Included in the output section of the amplifier is a double-tuned UHF resonator including inductors L7, L8, L10 and L11 which are tuned by varactor diodes D2 and D3 and frequency-selective coupling networks that include a capacitor $CS_2$, mutual inductances M and another inductor L9. In more detail, the anode of diode D2 is connected through the series combination of inductor L7 and inductor L8 to a ground plane, while the anode of diode D3 similarly is connected to a ground plane through the series combination of inductors L10 and L11. Stray capacitance $CS_2$ couples the upper ends of inductors L7 and L10 together. Inductor L7 is mutually coupled to inductor L10 and is also mutually coupled to inductor L9, one end of which is connected to the junction between inductor L10 and diode D3. The other end of inductor L9 is connected to the cathode of a diode D5. A mixing signal is taken from the anode of diode D5 and coupled into a mixer section generally disposed between ground plane 18 and still another ground plane 20 (represented by a lead), thhe latter extending substantially continuously across the layout with its upper and lower end portions being connected to peripheral ground planes.

The signal from the collector of transistor 14 is fed through a capacitor C18 to the junction between inductors L7 and L8. The junctions between inductors L10 and L11 and between inductors L8 and L7 are bypassed to ground plane 18 through a capacitor C19 and to ground plane 16 through a capacitor C17, respectively. The cathode of varactor diode D2 is coupled to ground plane 16 through a capacitor C16 and is connected to terminal $V_T$ through the series combination of a resistor R15 and a resistor R5. Similarly, the cathode of varactor diode D3 receives its tuning voltage by way of a resistor R17 and resistor R5. The latter cathode is coupled to ground plane 18 through a capacitor C20. The junctions between resistors R5 and R17 and between R5 and R15 are bypassed to ground plane 18 through a capacitor C6 and to ground plane 16 through a capacitor C4, respectively. Also, the junction between resistor R4 and inductor L6 is coupled to a common connection between ground planes 16 and 18 through a capacitor C5. Finally, a variable capacitor CV is coupled between the upper end of inductor L7 and ground plane 16.

Turning to the mixer section, an intermediate-frequency output terminal 22 is connected through the series combination of resistors R18 and R6 to the junction between resistor R4 and inductor L6. Also, the junction between resistors R6 and R18 is bypassed to ground plane 18 by a capacitor C7. From the anode of diode D5 at the output of the amplifier is a series electrical connection of an inductor L15, an inductor L16, an inductor L14, an inductor L13 and a capacitor C21, ending at IF output terminal 22. The junction between inductors L13 and L14 is connected through the series combination of an inductor L12 and a resistor R8 to the B+ terminal. The junction between inductor L12 and resistor R8 is returned to ground plane 20 through a resistor R7 parallelled by a capacitor C8. Finally, the junction between inductor L14 and inductor L16 is bypassed to ground plane 20 by a capacitor C22.

It will be observed that inductor L16 actually is located to the right of ground plane 20. The portion of the overall circuitry lying to the right of that ground plane generally comprises the local oscillator, including mixer coupling inductor L16. The primary active element of the oscillator is an NPN transistor 24 associated for tuning purposes with an inductor L17, a capacitor C23 and a varactor diode D4. The cathode of the latter is connected through a resistor R20 and a resistor R12 back to the source of tuning voltage at terminal $V_T$. A capacitor C23 bypasses the junction between tuning varactor diode D4 and resistor R20 to a ground plane, a capacitor C27 similarly bypassing to that ground plane the junction between the resistors R12 and R20. Also, the junction between varactor diode D4 and capacitor C23 is coupled through a capacitor C25 and a resistor R21 to the emitter of transistor 24 which is returned to ground through a resistor R22.

For operational energization, the collector of transistor 24 is connected through the series combination of an inductor L18, a resistance RL19, an inductor LR19 and a resistor R9 to the B+ terminal. Resistance RL19 and inductor LR19 represent the resistance and inductance of a ferrite bead which has the property of being radio-frequency sensitive without affecting its DC resistance. The B+ terminal also is connected through a resistor R10 to the base of transistor 24, with that base also being bypassed through a capacitor C26 to a ground plane. The junction between resistor R10 and the base of transistor 24 also is returned to ground through a resistor R11, while the junction between resistor R9 and inductor LR19 is bypassed to ground through a capacitor C10. Completing this circuitry, the collector of transistor 24 is coupled to the anode of diode D4 by a capacitor C24, while the latter anode also is returned to the ground plane through an inductor L17. As indicated by the curved, double-headed arrow labelled $M_7$, inductor L17 is mutually coupled to inductor L16.

As a matter of general operation, the tuner of FIG. 1 functions in the conventional superheterodyne mode. As will be observed, it features a radio-frequency amplifier using a common-base transistor operating from a single-tuned input circuit and feeding a double-tuned output circuit. The mixer section is of a single-ended diode type with a double-tuned intermediate-frequency output circuit. In itself, the local oscillator is of a modified Colpitts variety. In the mixer section, the amplifier radio-frequency signals selected by the input circuitry of the radio-frequency amplifier are heterodyned with the local oscillator signal to produce a difference-frequency signal which appears at IF terminal 22. All of varactor diodes D1–D4 exhibit capacitances that vary in response to the single tuning voltage at terminal $V_T$. The capacitance changes are caused to track each other and thereby maintain a constant intermediate-frequency signal.

The particular arrangement of the radio-frequency amplifier input section to which transistor 14 responds affords a very high attenuation, greater than 40DB, to the very-high-frequency or VHF television channels. At the same time, it also exhibits sufficient attenuation at frequencies in the 300 to 400 megahertz region to effectively counteract spurious resonances often encountered in radio-frequency amplifier output circuits. Moreover, the input circuit also improves the image-frequency response. At the same time, it has low insertion loss and exhibits an optimized source impedance thus obtaining a satisfactory noise figure and cross-modulation performance. Furthermore, the particular arrangement of the series of mutually-coupled single-tuned inductors is such as to provide a direct-current connection to ground from the antenna input terminal which eliminates the need for an antenna discharge resistor.

As will be described in somewhat more detail subsequently in connection with FIGS. 4 and 5, the double-tuned UHF resonating circuitry in the output section of the radio-frequency amplifier includes frequency selective coupling networks and provides a trap for undesired frequencies that maintains a specified frequency spacing relative to the passband throughout the nearly full octave tuning range. The arrangement is particularly advantageous and yet affords additional selectivity intermediate the process of RF amplification and that of mixing at both the image frequency and at a frequency four channels higher than the selected or tuned channel; the latter tends to cause a one-half intermediate-frequency spurious response to be generated in the mixer.

Figure 2A:
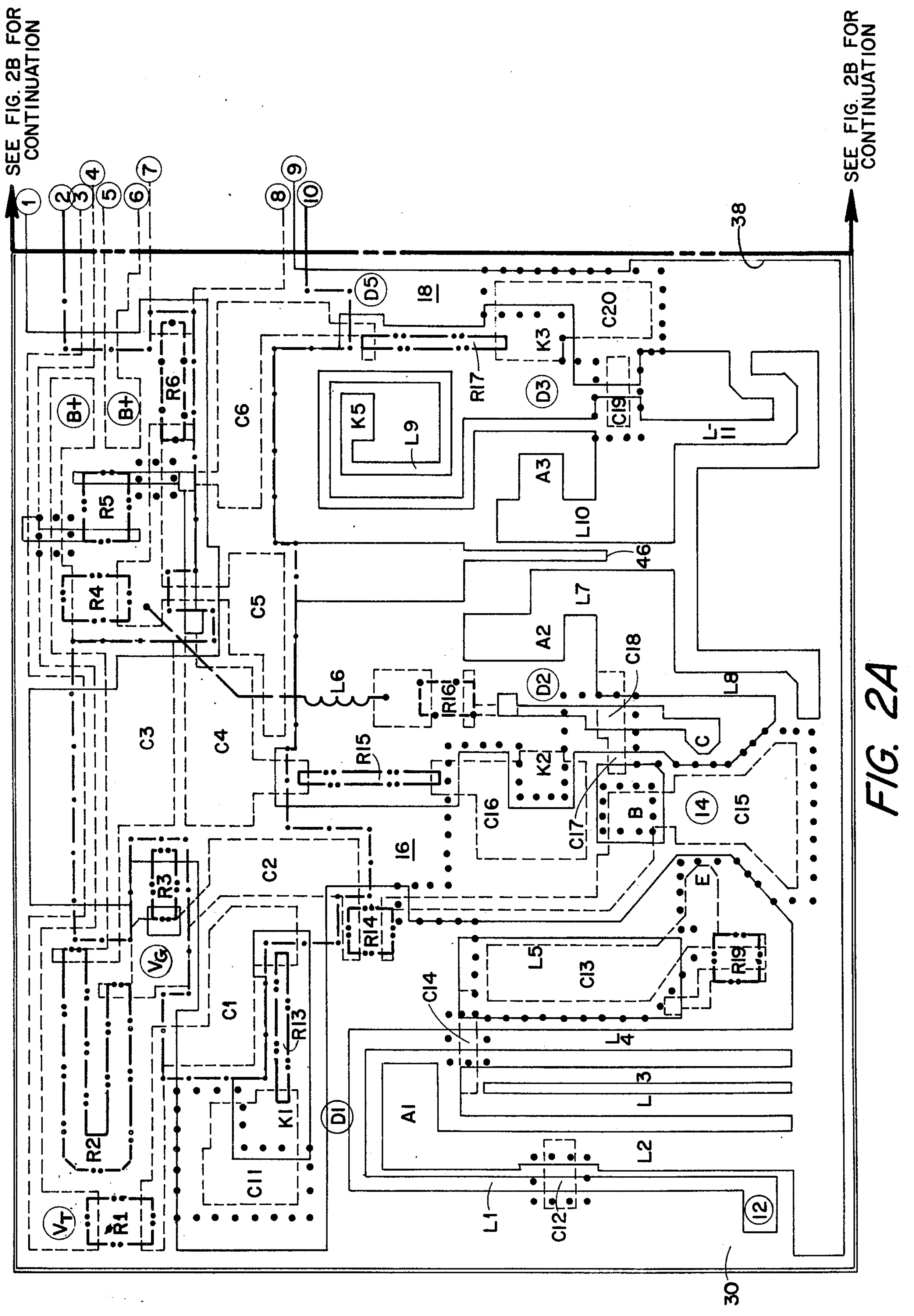
FIGS. 2A and 2B together constitute a layout diagram illustrating a principal portion of the circuitry depicted in FIG. 1.
Figure 2B:
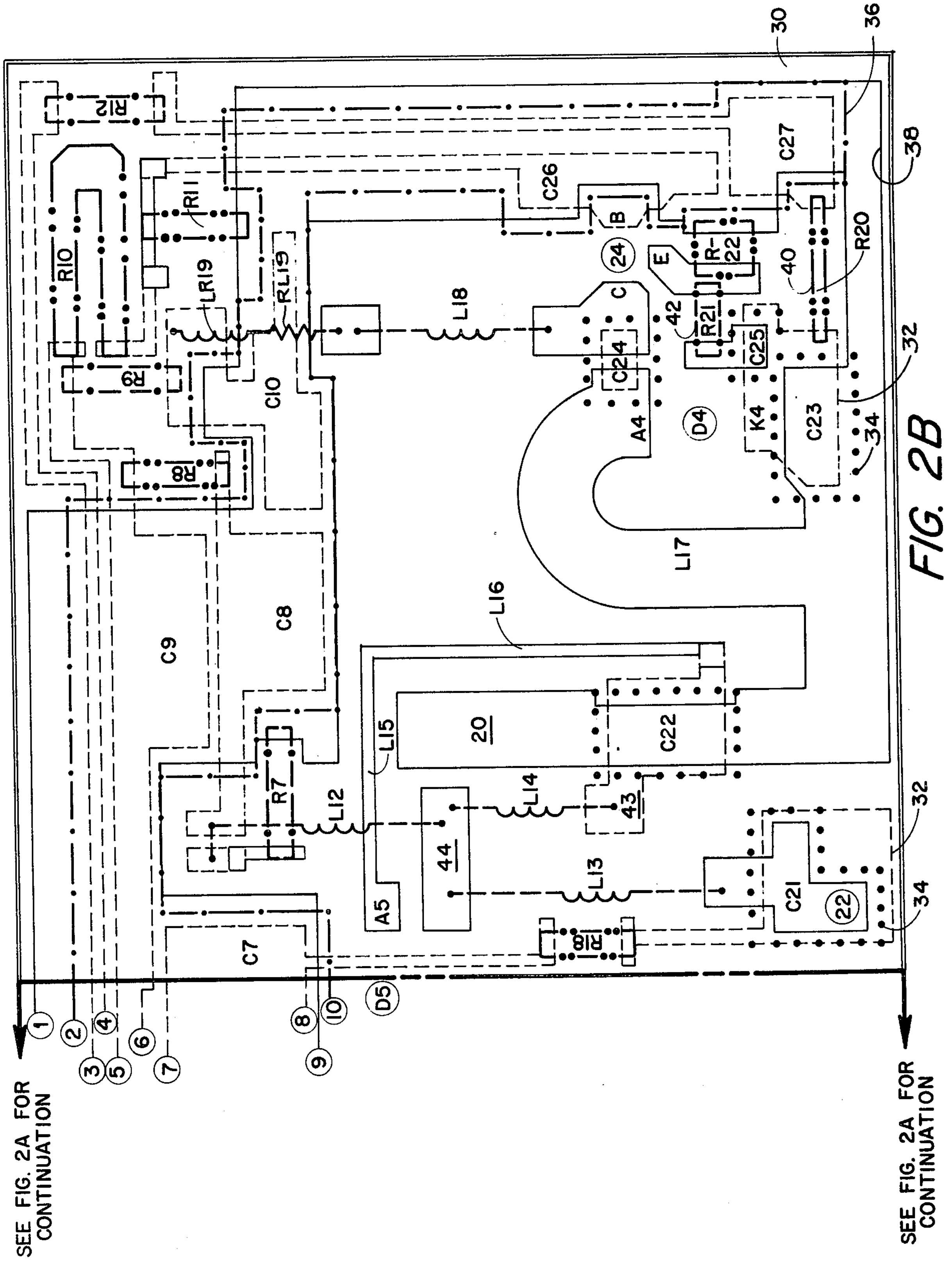

As so far described, the tuner of FIG. 1 may be constructed entirely of discrete components mounted on a conventional chassis or printed-connection board. Typically, that approach includes special wire or ribbon conductors which are formed at the time the tuner is aligned. Other discrete components include standard capacitors and resistors as well as active devices. Not only is the labor required for the assembly of such a discretecomponent tuner a substantial cost factor, but performance repeatability from one production tuner to the next can be achieved only by careful and time-consuming alignment procedures. To the end of simplifying and making the tuner of FIG. 1 more economical and performance reliable, it is constructed as shown in FIGS. 2A and 2B to utilize a substrate on which are formed, using techniques well known as such, almost all of the different resistive, inductive and capacitive components shown in the schematic diagram of FIG. 1. At the same time, the arrangement of the substrate is such as to permit automatic mounting and connection of the few remaining passive components as welll as of the active components.

Turning then to FIGS. 2A and 2B, the actual composite layout may be viewed in its entirety by aligning the right-hand edge of FIG. 2A with the left-hand edge of FIG. 2B. The small circled numbers 1–10 disposed along each of those edges denominate component-defining lines that extend between these two figures. As shown, a variety of different layers individually of respectively different materials are deposited in succession and in individually different patterns upon one surface of a substrate 30 of electrically-insulative material which also is non-magnetic. Although greatly enlarged in the drawing for purposes of illustration, one actual embodiment utilizes for substrate 30 a thin slab of alumina having a width of 1.5 inches, a length of 3.75 inches and a thickness of 0.025 inch. After thorough cleaning of the surface of substrate 30 to remove all traces of contaminants, a bottom layer of electrically-conductive material is deposited in a sharply defined but discontinuous pattern upon the upper surface of the substrate. That pattern is illustrated by dashed lines as at 32. After curing of that first layer, a second layer is deposited to overlie the first, again in a disconnected pattern and this time of a first dielectric material with the outlines of the different portions of this pattern being indicated by dotted lines as at 34. Next in succession of application is another layer in a disconnected pattern, this time of a higher-dielectric material having its pattern boundaries depicted by use of dash-dot lines as at 36. A fourth layer subsequently is applied as represented by the solid-line outline, an example of which is designated 38. This fourth layer is electrically conductive. Still a fifth layer, of a resistive material, is then applied in its disconnected pattern as represented by dash-double-dot lines, an example of which is shown at 40. Finally, so far as illustrated in FIGS. 2A and 2B, a material of higher resistivity is applied with the different portions of its disconnected pattern being represented in outline by double-dash-dot lines as at 42. Although not shown specifically, the entire substrate and all of the different layers as just described then are coated with non-magnetic, electrically-insulating material for physical protection.

In each step of the fabrication, the specific layer is deposited by silk-screening or otherwise printing the pattern, using a paste of the desired material. Subsequently, but before applying the next layer, the substrate is baked at a comparatively high temperature in order to cure the paste. In a specific embodiment heretofore constructed, the lower dielectric material is formed of a paste which exhibits a capacitance of thirteen-hundred and fifty picofarads per square inch. The higher dielectric paste exhibits a capacitance of fifteen-thousand picofarads per square inch. The higher resistance layer is formed from a resistive paste exhibiting one kilo-ohm per square, while the lower-resistive paste exhibits a resistance of thirteen ohms per square.

After completion of the layers, the few discrete components are appropriately positioned and soldered into place. As illustrated, the only passive components to be added are inductors L6, L12, L13, L14 and L18, each of which is a wire-wound radio-frequency choke, together with the ferrite bead which serves both as RL19 and LR19. In the case of inductor L14, for example, its two lead ends are simply soldered to an exposed portion of a segment 43 of the bottom conductive layer and a segment 44 of the upper conductive layer. The other add-on inductors or chokes are similarly soldered to respective segments of one or the other of the two conductive layers.

The locations of the different active components are indicated in FIGS. 2A and 2B by their number, as utilized in FIG. 1, enclosed in a small circle. Moreover, the electrical connection points for the transistors are indicated by use of the designations C, E and B corresponding to collector, emitter and base, respectively. Analogously, the connecting points for the diodes are indicated by the use of the letters A and K corresponding to anode and cathode followed by the diode number. For example, for diode D4, the two connecting points are labelled A4 and K4. This denomination scheme is apparent near the lower right hand corner of substrate 30 where the circled numeral 24 is disposed between the three points labelled C, E and B, representing the collector, emitter and base connections for transistor 24. Just to the left of that transistor location is the circled designation D4 between the designations A4 and K4, thus illustrating the location of diode D4 as well as the points of its anode and cathode connections.

Besides ground plane connections to be made to an enclosing housing, as will be subsequently described, the only other points of connection to the substrate assembly are those for applying the different operating voltages, coupling the input signals from the antenna and for supplying the intermediate-frequency signal from the substrate. In each case, these are depicted by the same symbol or number as in FIG. 1 but shown within a small circle. Thus, antenna connection terminal 12 is indicated in a small circle at its connection point on a segment of the upper conductive layer. Analogously, at the upper left-hand corner, the tuning-voltage terminal is indicated by the representation $V_T$ in a circle on top of a segment of the bottom conductive layer. Similarly, connection points are indicated for the automatic gain control voltage terminal $V_G$, the energizing power source B+ and the intermediate-frequency signal output terminal 22.

Also represented in FIGS. 2A and 2B are the approximate locations of the various different passive components defined by the variety of different segments of the various layers. Moreover, a comparsion of FIGS. 1 and 2A–2B will reveal that, in terms of distance between top and bottom or left and right of the respective figures, the location of any particular component is approximately the same; of course, this aids in interpreting these figures in light of FIG. 1. Generally speaking, a resistor is formed by a segment of one of the two resistive layers bridging a pair of segments of one or the other of the conductive layers. On the other hand, a capacitor is formed by the disposition of a segment of one of the two capacitive layers between a segment of the bottom conductive layer and an overlying segment of the top conductive layer. Finally, certain of the inductors are created out of repective different segments of the upper conductive layer, such inductive segments being of the strip transmission-line type and represented by inductors L1–L5, L7–L11 and L15–L17.

By noting the different component designations at the various different locations throughout FIGS. 2A–2B and comparing certain designated areas with the components of the same designation in FIG. 1, one may trace the circuit of FIG. 1 in the layout of FIGS. 2A–2B and see how the different passive components of FIG. 1 are formed in FIGS. 2A–2B. It will be observed that the lower conductive layer forms a plurality of connective elements in the tuner. The dielectric layers, of course, are basic to the capacitive elements. The upper conductive layer then defines in conjunction with the lower conductive layer and the dielectric layers, the capacitive elements while at the same time creating most of the inductive elements and also defining still another plurality of connective elements. Finally, the resistive layers interconnect different portions of the conductive layers in order to complete the definition of both the resistive and the connective elements.

As a first more-detailed illustration of the manner in which the different circuitry is formed, reference may be made to the portion of substrate 30 near its lower left-hand corner. The input section of the radio frequency amplifier is formed to include inductors L1–L5 as a succession of spaced transmission-line strips. The mutual inductance between the strips is determined by the spacings therebetween as well as their mutually-adjacent lengths. Capacitor C12, which in FIG. 1 extends from a tap on inductor L1 to a tap on inductor L2, is formed by a segment of the bottom conductive layer disposed to underlie the mid portion of each of inductive strips L1 and L2, and a segment of the lower-dielectric layer interposed between the underlying conductive segment and the overlying conductive strips. Capacitor C14 is similarly formed as indicated to couple the conductive connection between the upper end of inductors L3 and L5 to the conductive connection between the upper ends of inductors L1 and L4. To the left of transistor 14, resistor R19 is formed by a segment of the high resistance layer bridging spaced segment of the bottom conductive layer; one of those latter segments also connects resistor R19 to the emitter of transistor 14.

The same approach exists throughout the layout of FIGS. 2A–2B. Generally, both the orientation and the extent of the upper conductivve layer is selected so as to obtain both the desired value of inductance as well as all necessary mutual coupling between different inductors and capacitive coupling to ground. For example, it will be observed that there is an enlarged area of the upper conductor at the upper end of inductor L2; this permits attaining the desired degree of stray capacitance $CS_1$ to ground. The spacings between inductors L1, L2, L3, L4 and L5 are chosen to obtain the desired degree of mutual inductance.

Generally speaking, undesired stray capacitance is compensated by the corresponding assignment of particular values of inductance to the inductors thereby affected. In one case, an increased amount of stray capacitance is specifically introduced in order to achieve a desired degree of coupling and compensate the mutual coupling of inductors L7 and L10 at the high end of the UHF band. This is with respect to capacitor $CS_2$ shown in FIG. 1 as being connected between the upper ends of inductors L7 and L10. That additional stray capacitance is controlled in the arrangement of FIG. 2A by the inclusion of a narrow strip 46 of the upper conductive layer physically interposed between the other segments of that upper conductive layer that constitute inductors L7 and L10. By adjusting the length of strip 46, the total coupling of the double-tuned circuit may be varied. Strip 46 is essentially at ground plane potential by reason of its physical connection with the large area of the upper conductive layer generally along the top portion of substrate 30 which is grounded by connection to the enclosing housing.

Advantageously, different portions of the inductor-forming segments of the upper conductive layer are folded back to define closed-loop inductors which are generally self-contained both magnetically and electrically. For example, inductor L17 will be seen to include a strip which is partially folded back upon itself before terminating in capacitor C24 and the connection point for the anode of diode D4. Moreover, diode D4 and capacitor C23 establish an intercoupling of inductor L17 back upon itself at its lower end to complete a closed loop for signals at the local-oscillator frequency. Consequently, the resonant circuit including inductor L17 exhibits a higher Q, because the closed-loop configuration avoids the need for unnecessary solder joints that otherwise would result in circuit losses. Also, the combination minimizes any inductance that would appear in the ground return paths. Repeatability of inductance during manufacture, as between successively fabricated substrates, is enhanced by avoiding ground paths which extend over the edge of the substrate or through housing walls adjacent to the circuitry. Furthermore, the looped configuration of inductor L17 also minimizes the amount of substrate area required for the definition of that inductor. Another advantage of the closed loop configuration is that it aids in isolating the defined circuitry from other circuits. Its freedom from other conductive elements obviates the need for any mechanical attachments to some such other element. The use of a folded strip approach also will be noted elsewhere in the overall circuitry such as in the case of the formation of inductors L7–L11 and inductors L1 and L4.

Figure 3:
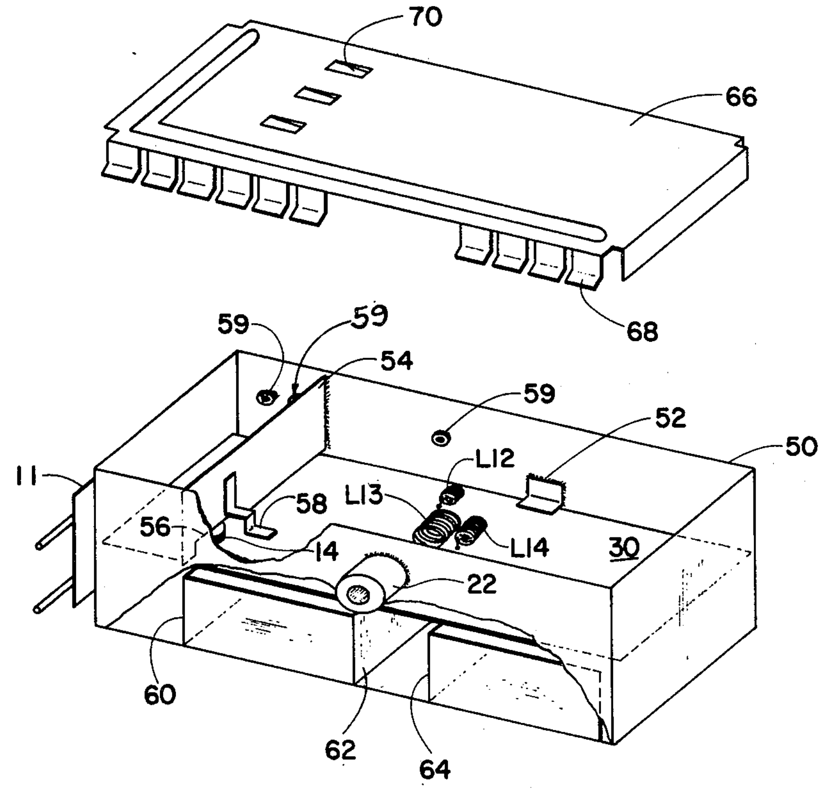
FIG. 3 is a perspective view of a mechanical assembly of the tuner of FIG. 1, its cover plate being separated in the drawing.

In use, substrate 30 preferably is enclosed within a box-like housing 50, one version of which is shown is FIG. 3. Housing 50 is fabricated of an electrically conductive material which forms complete ground plane connections as well as affording magnetic shielding. The housing 50 is rectangular and of sufficient size and depth to suspend substrate 30 approximately as shown. The substrate may be supported with screws threaded into ledges formed by small, bent-in flaps (not shown) of the housing or, more simply, by means of tabs, as at 52, spot welded or soldered to the housing walls and soldered to the peripheral ground plane areas of the substrate. The different conductive edge portions of the upper layer of substrate 30 are thus electrically connected to the housing walls to complete the formation of the ground planes depicted around the periphery of FIG. 1.

An electrostatic shield 54 is disposed in housing 50 between its front and rear walls connected in perpendicular relationship to the conductive layer forming ground plane 16. The shield separates the input and output sections of the radio-frequency amplifier. A notch 56 in shield 54 accommodates transistor 14. A tab 58 projects laterally from shield 54 and overlies the upper end of the conductor that forms inductor L7 in FIG. 2A. Adjustment of the spatial relationship between tab 58 and substrate 30 varies the value of capacitance CV for alignment purposes. In effect, shield 54 is a vertical extension of the ground plane. Similar shields may be positioned above ground planes 18 and 20, and additional tabs, analogous to tab 58, included to project adjacent to respective inductive tuning elements in the oscillator and mixer sections to provide added flexibility in alignment.

FIG. 3 also shows several of the discrete components L12, L13 and L14 attached to the substrate. Other discrete components may be similarly affixed in their respective locations. Low-capacity feed-through elements 59 accommodate external wiring which leads to terminals $V_T$, $V_G$ and B+. Preferably, additional grounded shields 60, 62 and 64 are disposed within housing 50 beneath substrate 30 between the respective different portions of the tuner. Housing 50 is closed by a conductive top 66 which is held in place by means of resilient fingers 68. Downward depending fingers 70 engage the upper edge of shield 54.

Figure 4:
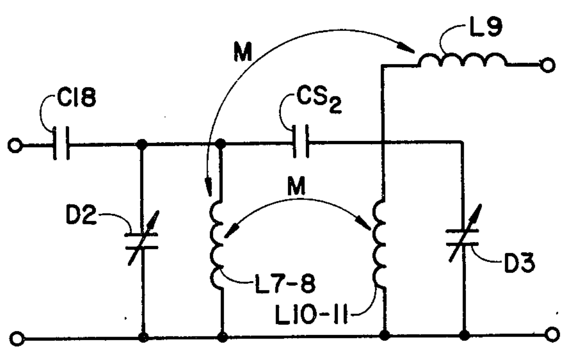
FIG. 4 is a schematic diagram of a portion of the circuitry of FIG. 1 with certain generalization and simplification.

FIG. 4 illustrates in a more generalized manner the basic nature of the double-tuned resonator, with its frequency selective coupling networks, utilized in the output section of the radio-frequency amplifier. Inductors L7 and L8 and L10 and L11, respectively, are shown lumped into single inductors. The lumped inductors are connected together at their lower ends and coupled at their upper ends by capacitor $CS_2$. Lumped inductor L7–8 is shunted by tuning capacitor D2, and lumped inductor L10–11 similarly is shunted by tuning capacitor D3. The input signal to the section is coupled through capacitor C18. Another inductor L9 is connected at one end to the top of lumped inductor L10–11 and at its other end to an output terminal which, in the case of the circuit of FIG. 1, feeds mixer diode D5. The inductors are positioned to produce a selected mutual inductance between the various inductors. This is indicated in FIG. 4 by the curved arrows labelled M.

Figure 5:
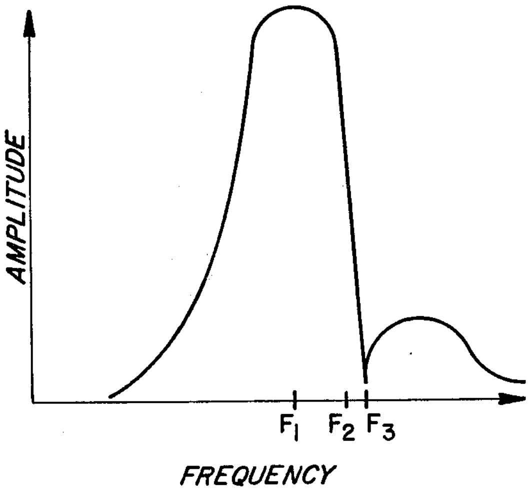
FIG. 5 is a curve illustrating one response characteristic available with the circuitry of FIG. 4.

FIG. 5 illustrates an idealized frequency response curve obtained with the circuit of FIG. 4. The curve peaks at a design-center frequency F1, exhibits an upper-side selectivity with a one-half intermediate frequency of F2 and a well-defined upper trap at a frequency F3. By reversing the sign of the mutual coupling between inductor L9 and lumped inductor L7–8, the position of trap frequency F3 may be shifted to the lower side of the response curve. With reference to FIG. 2A, this may be achieved by reversing the spiral direction of the squared-helical strip defining inductor L9.

As already indicated in part, the circuitry of FIG. 4 is capable of being tuned over nearly an octave frequency range by use of a varactor diode. Within that range, the bandwidth, and the distance between frequencies F1 and F2 in FIG. 5, remains relatively constant as does the spacing of trap frequency F3 from either of the other two. In the specific tuner application herein involved, the FIG. 4 circuit provides additional selectivity between the radio-frequency amplifier and the mixer circuitry at the image frequency as well as at a frequency four television channels higher than the tuned channel in order to preclude generation in the mixer of a spurious response at one-half the intermediate frequency. With reference to FIG. 5, the one-half intermediate frequency is at F2 and the image interference frequency is at F3.

Having thus understood the various details of the disclosed embodiments, it will be apparent that a number of particularly advantageous features are included. At the outset, the entire tuner assembly is nicely compact. Of even more importance, however, it may be fabricated entirely by machine operations without the necessity for manual labor even as to the mounting of the few discrete components. Only a final quick alignment, involving capacitive trimming tab adjustment, is necessary. Also involved are a number of more detailed features. For example, each of the four primary resonant circuits of the tuner are individually closed upon themselves along walls of the housing; this affords improved selectivity and reduced stray coupling. The employment of one or more simple trimmer tabs formed out of the walls of the housing further assures low stray coupling as well as satisfactory automatic gain control performance. Printing of the components fixes the mutual coupling between each of the different inductive circuits and the performance of successive tuners, and especially of the mixer sections therein, is precisely set within certain bounds. No adjustment is required of mixer injection current as a result of which alignment time is minimized.

Other advantages include the use of only one side of the substrate, resulting in reduced costs and enhanced production yields. No holes are necessary in the substrate. All capacitors are printed. The use of extensive printing, and thus effective printing of all stray capacitances and mutual couplings, enables a high degree of repeatability of values in production from one tuner to the next. All of the foregoing results both in higher reliability and in lower overall costs.

While a particular embodiment of the present invention has been shown and described, it is apparent that changes and modifications may be made therein without departing from the invention in its broader aspects. The aim of a appended claims, therfore, is to cover all such changes and modifications as fall within the true spirit and scope of the invention.

What is claimed is:

1. A UHF tuner comprising a box-like housing having walls of electrically conductive material and including a radio-frequency amplifier tunable to receive selected signals in the UHF spectrum, a local oscillator tunable to develop a mixing signal displaced in frequency from that of the selected signal by a constant amount and a mixer responsive to said amplified selected signal and said mixing signal for producing a constant-frequency intermediate signal, said amplifier, said oscillator and said mixer being composed of inductive, capacitive, resistive, connective and active elements, the improvement in said inductive, capacitive, resistive and connective elements comprising:

a substrate, of non-magnetic electrically insulating material, supported within said housing;

a first layer of electrically conductive material disposed on said substrate in a disconnected pattern defining a plurality of said connective elements;

a second layer of at least one dielectric material overlying said first layer in a disconnected pattern;

a third layer of electrically conductive material overlying said second layer in a disconnected pattern defining with said first and second layers said capacitive elements, forming at least a portion of said inductive elements, and defining another plurality of said connective elements;

a fourth layer of at least one resistive material disposed in a disconnected pattern interconnecting different portions of said first and third layers to complete the definition of said resistive and connective elements;

and means mounting said active elements on said substrate in interconnective relationship with said first and third layers.

2. A tuner as defined in claim 1 which includes a plurality of electrically conductive planar shields disposed perpendicularly to said substrate and individually oriented between adjacent ones of said amplifier, mixer and oscillator, said shields being effectively connected to adjacent portions of said third layer.

3. A tuner as defined in claim 2 in which different ones of said shields are disposed respectively above and below said substrate.

4. A tuner as defined in claim 2 in which a tab portion of at least one of said shields overlies at least one of said inductive elements defined by said third layer and is adjustable in position toward and away from said substrate for trimming the response frequency determined by that inductive element.

5. A tuner as defined in claim 2 in which an additional shield, parallel to the other shields, is disposed between the input and output portions of said amplifier.

6. A tuner as defined in claim 1 in which said amplifier includes an input section having a plurality of inductive elements spaced apart in succession with each one being mutually coupled to the next, said plurality of inductive elements being defined by a succession of strips of said third layer forming a single-tuned input circuit.

7. A tuner as defined in claim 6 in which five inductive elements are included in said plurality of inductive elements, the first of said inductive elements having its lower end connected to receive said broadband signals and its upper end connected to the upper end of the fourth element and capacitively coupled to the fifth and third elements, the lower ends of the second, third and fourth elements being connected in common, the upper ends of said third and fifth elements being connected together and the upper end of the second element being connected to a varactor adjustable in determination of the tuning of said input section.

8. A tuner as defined in claim 7 in which one of said capacitive elements is coupled between taps located on said first and said second of said inductive elements.

9. A tuner as defined in claim 1 in which said amplifier includes an output section having a double-tuned resonator with frequency-selective coupling networks, said output section being composed of a pair of spaced mutually-coupled inductive elements connected at one end to a common ground and capacitively coupled at their other ends;

a third inductive element mutually coupled to at least one of said pair and conveying signals from the output of said section;

means for coupling input signals to said section across a first one of said pair of inductive elements;

and a pair of commonly-tuned varactors individually coupled across respective ones of said inductive elements in said pair.

10. A tuner as defined in claim 1 in which said amplifier includes an output section having a double-tuned resonator with frequency-selective coupling networks, said section exhibiting reduced signal response at a frequency one-half said constant frequency and at the image of the frequency difference between the frequencies of said broadband signal and said mixing signal.

11. A tuner as defined in claim 1 in which said amplifier, oscillator and mixer each include resonant circuits defined by portions of said third layer and in which said portions are closed upon themselves along the walls of said box.

12. A tuner as defined in claim 1 in which at least one of said inductive elements includes a strip of said third layer a portion of which is folded back toward itself, thereby defining a substantially magnetically and electrically self-contained closed-loop inductor.

13. A tuner as defined in claim 12 in which a portion of said second layer defines at least one capacitor intercoupling opposing ends of the folded strip and establishing resonance therewith.

* * * * *